June 27, 1967 RICHARD C. CHU ET AL 3,328,643

COOLING DEVICE FOR ELECTRONIC COMPONENTS

Filed June 30, 1965

INVENTORS
RICHARD C. CHU
STEPHEN N. KOCHIS
HENRY MAYRON

BY Robert W. Ely
ATTORNEY

United States Patent Office 3,328,643
Patented June 27, 1967

3,328,643
COOLING DEVICE FOR ELECTRONIC COMPONENTS

Richard C. Chu, Stephen N. Kochis, and Henry Mayron, Poughkeepsie, N.Y., assignors to International Business Machines Corporation, Armonk, N.Y., a corporation of New York Filed June 30, 1965, Ser. No. 468,245
10 Claims. (Cl. 317—100)

ABSTRACT OF THE DISCLOSURE

An assembly of chained heat sinks of a specific configuration formed by molding a particular plastic frame to certain parts of the heat sinks. The sheet metal heat sink is formed to clamp on transistors and has depending clamp fingers and L-shaped ears extending horizontally. The ears have depending side walls for channeling of cooling air. The molded plastic frame engages the side wall portions of the heat sinks and thus align the heat sinks for air flow. Further, the chained heat sinks, of course, can be more readily mounted and the plastic provides electrical insulation at the sides, tops and ends of the heat sinks.

Figures 1, 2:
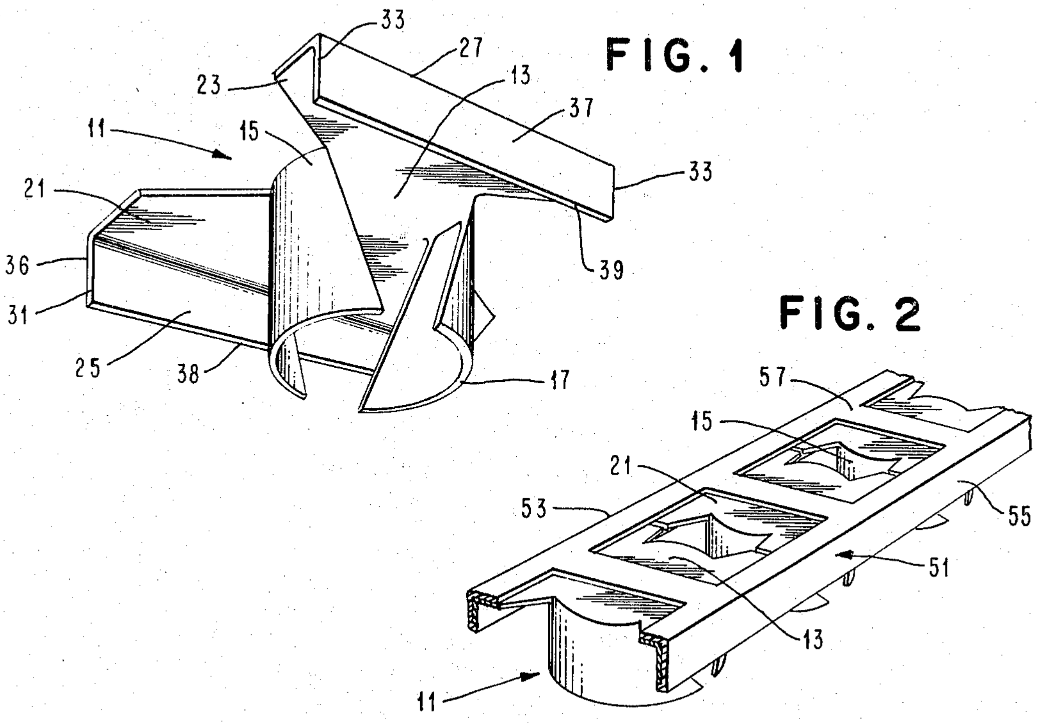

This invention relates to cooling devices for electronic equipment nad more particularly, concerns means for dissipating the heat from a multiplicity of small components, such as transistors and diodes, which are closely-spaced in all directions.

An improved heat sink for transistors has been designed and provides for transfer of heat and the funneling of cooling air. This heat sink is clipped on the cylindrical top of a transistor by means of two arcuate portions which are formed downwardly from the ends of a sheet metal blank. In order to provide maximum heat transfer and a chaneling effect for cooling air, the two generally-triangular sides of the sheet metal blank are bent downwardly at their edge parts to provide L-shaped ears having a depending side wall or channels. The L-shaped ears of adjacent heat sinks when aligned assist in the channeling of cooling air and give large surfaces for heat radiation. It is apparent that the individual installation of such heat sinks is a time-consuming operation, especially if the depending wall of the ears are to be precisely aligned for air channeling. Another problem resides in the possibility that, with maximum extension toward the adjacent heat sink, there is the possibility of electrical shorting by end contact between neighboring heat sinks in a given column. Also, with a slight rotation of the heat sink on the transistor, there is the possibility of short circuiting by side contact of heat sinks in adjacent rows. Further, since the transistors are mounted on cards with the transistors on one side and solder or conductive paths on the other side facing the transistors of the adjacent card, there is the possibility in such dense packaging that the top of heat sink might electrically short to the facing conductive path or solder.

An object of the present invention is to provide an improved heat dissipating device or assembly of metallic heat sinks and a plastic frame which gives heat dissipation, overcomes the aforenoted problems, and permits the installation of a plurality of heat sinks at one time.

A further object is the provision of such a heat sink assembly wherein the heat sinks are chained together by a plastic frame to prevent electric shorting at the ends of the heat sinks.

Another object is to provide such a unitary assembly of heat sinks and a plastic frame which presents side insulation to prevent electric contact with an adjacent column of electrical components.

An additional object is the provision of a molded assembly of heat sinks and a plastic frame which is easily installed and removed and presents end and side electrical insulation for the heat sinks.

A further object is the provision of an electronic package having closely spaced transistor on boards and assemblies of metallic heat sinks and a plastic frame whereby a plurality of heat sinks are aligned and simultaneously mounted on transistors with the plastic frame giving end, side, and top electric insulation.

Figure 3:
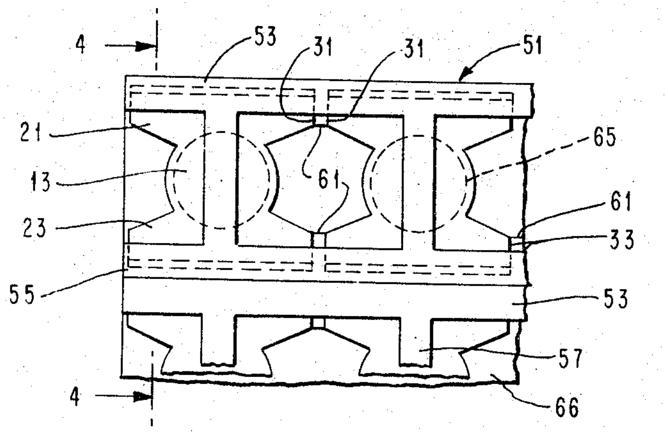
Figure 4:
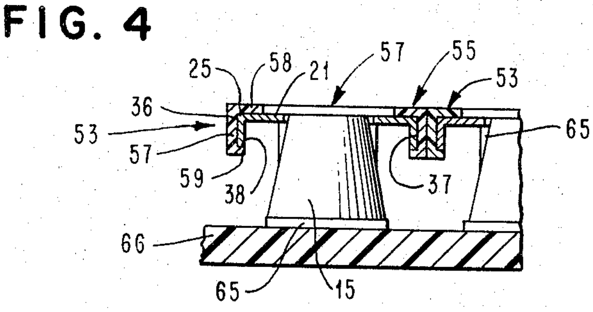

The realization of the above objects, along with the features and advantages of the invention, will be apparent from the following description and the accompanying drawing in which:

FIG. 1 is a perspective view of a heat sink or dissipator for transistors and shows depending mounting fingers and laterally projecting ears with a depending edge wall, FIG. 2 is a perspective view of an assembly of the heat sinks and a plastic chaining or linking frame which has two encasing side rails and cross bars over the tops of the heat sinks, FIG. 3 is a top view of parts of two assemblies and shows the arrangement when the assemblies or heat dissipating devices are clamped on closely-spaced transistors mounted on a printed circuit board, and FIG. 4 is a view taken on line 4—4 of FIG. 3 and shows how the rails of the nylon frame encase the edge wall part of the ears of the heat sinks.

In accordance with a preferred embodiment of the invention, four of the above-described heat sinks having clamping fingers and laterally-extending ears with depending side walls are chained or linked together by a nylon molding or frame. This plastic frame has side rails which encase the side walls and further has projections which protrude between the facing ends of the ears. Thus, an assembly is provided which is easily mounted, being slightly flexible, and which gives side, end and top electrical insulation. Preferably, the rails are joined by cross bars which extend across the tops of the heat sinks and give a stronger assembly and additional top insulation. The plastic frame gives alignment of the heat sink side walls for channeling air and leaves a maximum of the heat sink surfaces exposed for heat transfer. An electronic package with heat dissipation results when several of the assemblies are used on transistors closely-spaced on a board.

Referring to the FIG. 1, the sheet metal heat sink 11 has a base portion or center section 13 which is flat and adapted to abut the top of a transistor. From opposed end parts of the base portion 13, two arcuate clamping fingers 15 and 17 project perpendicularly or depend for resiliently engaging a transistor and to dissipate heat therefrom. From opposed side parts of the base portion 13, two flared ears 21 and 23 extend laterally and project endwise beyond the profile of the clamping fingers 15 and 17 and the base portion 13. Each perpendicularly extending ear 21 and 23 laterally terminates in a side edge surface from which depend side walls 25 and 27. Each generally-triangularly-shaped ear 21 and 23 has respectively two opposed ends 31 and 33, which include the end part of the ears and the depending, elongated walls of the ears. Depending side walls 25 and 27 respectively have outer side surfaces 36 and 37 and bottom edges 38 and 39. Such a heat sink and the method of manufacture are the subject matter of U.S. patent application Ser. No. 333,920, filed Dec. 27, 1963, by Chu et al., and assigned to the same assignee of this application, now U.S. Patent 3,247,896.

In order to provide an easily-installed assembly having the preferred number of four heat sinks, the individual heat sinks 11 are mounted in the bottom half of a mold. The circular clamping fingers are inserted in round openings and the ears are received in triangular recesses. The insertion provides alignment of the channel walls of the ears and hence the heat sinks and gives a small but adequate spacing at the adjacent ends of channel walls. Other suitable recesses at the top, side and bottom of the channel wall and at the transverse top parts of the base portion and ears are provided by the bottom and top halves of the mold so that by means of suitable runners and gates nylon is conventionally injected and molds to the heat sinks to give the broken-away assembly, shown in FIG. 2.

Referring to the perspective view of FIG. 2, the external appearance of the assembly shows the heat sinks 11 and a plastic frame 51. The preferred number of heat sinks is four and the maximum plurality would be twelve. The nylon frame 51 has two side rails 53 and 55 and cross bars 57. The cross bars 57 extend perpendicular to the rails 53 and 55 and hence to the ear side walls. It is contemplated that other electrically-insulating plastics, such as polysulfone and polyphenylene oxide, can be used since relatively good thermal conductivity, strength and slight flexibility result in the frame. With this easily-mounted assembly, cooling air can be channeled lengthwise around the clamping fingers and transistors and can also pick up heat from the interiorly-exposed surfaces of the ears, as will be more apparent from the FIGS. 3 and 4.

Referring to FIGS. 3 and 4, the details of the frame 51 are shown. The rails 53 and 55 have a generally-square-C shaped cross section and have upright sections 57, top flanges 58 and bottom flanges 59 (FIG. 4). It is apparent that the upright plastic sections 57 contact the outer side wall surface 36 while the bottom flanges 59 contact the side wall bottom edge 38 and 39. The top plastic flanges 58 contact a narrow top surface at the side part of the flared part of the ears 21, above its side wall 25. Further, the side rails 53 and 55 respectively have projections 61 (FIG. 3) which extend between and contact the ends 31, 33 of the ears 21 and 23 whereby proper columnar spacing and insulation to prevent electrical shorting between adjacent ends of the closely spaced heat sinks are provided, as well as a slight flexibility to the assembly which facilitates mounting. While FIG. 3 shows close spacing of transistors 65 in both column and row directions, FIG. 4 shows close spacing of transistors 65 in the rows and also shows the transistors 65 mounted on a printed circuit board 66 whereby rows of components are insulated at their facing sides by means of plastic rails 55 and 53. It is to be appreciated that, with a board having forty-eight transistors, for example, only some of the transistors will be generating heat and that the other heat sinks will have heat transferred to them.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A heat dissipating assembly for electrical components, such as transistors, comprised of:

a plurality of metallic heat sinks, each of said heat sinks having cup-like means for mounting on a transistor and for contacting the top and sides of a transistor, each of said heat sinks having flared structure projecting perpendicularly from each side of said cup-like means and terminating with an elongated edge part, said metallic heat sinks being arranged so that the respective edge parts are aligned, and plastic means molded to a limited part of each of said flared structures to maintain the aligned arrangement of said heat sinks and constructed and arranged to provide electrical insulating at the edge parts.

2. A heat dissipating assembly for electrical components, such as transistors, comprised of:

a plurality of metallic heat sinks, each of said heat sinks having clamping means for mounting on a transistor and for contacting the sides of a transistor, each of said heat sinks having flared structure projecting perpendicularly from each side of said clamping means and terminating with an elongated edge, said metallic heat sinks being arranged so that the respective edegs are aligned, and plastic means molded to a limited part of each of said flared structures to maintain the aligned arrangement of said heat sinks and constructed to space the aligned flared structures and to provide electrical insulation at the edges and relatively good heat transfer.

3. A heat dissipating assembly for electrical components, such as transistors, comprised of:

a plurality of metallic heat sinks, each of said heat sinks having cup-like means for mounting on a transistor and for contacting the top and sides of a transistor, each of said heat sinks having flared structure projecting perpendicularly from each side of said cup-like means and terminating with an elongated edge and two ends, said metallic heat sinks being arranged so that the respective edges are aligned and the ends of adjacent heat sinks are in closely-spaced, facing relation, a plastic frame molded to said heat sinks to maintain the aligned arrangement of said heat sinks, and said plastic frame including two side elements respectively encasing said aligned, elongated edges and having projections extending between and contacting the adjacent facing ends of said flared structures of said heat sinks.

4. The assembly according to claim 3 and being further characterized by:

said plastic frame further including narrow cross bars extending between said side elements of said frame and across the cup-like means and flared structures of each of said heat sinks.

5. The assembly according to claim 4 and being further characterized by:

each of said flared structures having a depending wall which terminates as said elongated edges.

6. A heat dissipating device for a plurality of electrical components, such as transistors, comprised of:

a plurality of heat sinks each having a flat base portion adapted to abut the top of an electrical component and having two ends and two sides, each of said flat bases having clamping structure depending therefrom at each end for engaging an electrical component, each of said flat bases having a flat ear extending from each side thereof to form a straight edge structure having ear ends, said heat sinks being arranged so that said edge structure of said ears are aligned and spaced with a slight gap between adjacent ear ends, a plastic frame being formed of an electrically-insulating, plastic, and said plastice frame having side elements bonded to said edge structures of said heat sink ears and projecting into and filling the gaps between adjacent ear ends and having contact with the ear ends.

7. The assembly according to claim 6 and being further characterized by:

said plurality of heat sinks being four, each of said edge structures including a depending wall having an outer side surface and bottom edge, and said plastic frame being bonded to said outer side surface and said bottom edge of said depending wall of said edge structure.

8. The assembly according to claim 7 and being further characterized by:

said plastic frame being nylon and including narrow cross members extending between its side elements and respectively across each of the base portions and ears of said heat sinks.

9. A heating dissipating device for a plurality of electrical components, such as transistors, comprised of:

a plurality of identical sheet metal heat sinks, each of said heat sinks having a base portion which has two opposed end parts and two opposed side parts, two arcuate clamping fingers respectively depending from the two end parts of said base portion, two flared ears etxending laterally from the two side parts of said base portion, each ear terminating with an edge surface and a depending side wall having opposed ends, an outer side surface, and a bottom edge, said heat sinks being arranged so that the side walls of said ears are aligned and the adjacent ends of the side walls are slightly spaced from each, a ladder-like nylon frame having two side rails molded to said heat sinks, said two side rails of said frame being generally square-C-shaped in cross section to provide an upright section, a top flange and a bottom flange, said two side rails being respectively arranged in relation to aligned ears so that said top flange, said upright section and said bottom flange respectively contact said edge surface of said ear, said outer side surface, and said bottom edge of said side wall, said side rails having projections extending between adjacent ends of said side walls of said ears whereby contact and possible electrical shorting is prevented, and said frame having cross bars perpendicularly connecting the top flanges of said rails and contacting narrow portions of said base portion and said ears.

10. An electronic package comprised of:

a mounting board and a plurality of electronic components mounted and uniformly spaced on said board in rows and columns, heat dissipating devices mounted on each of said components and each having heat-dissipating means respectively projecting toward adjacent heat dissipating means in said columns of components, chaining means molded to said devices and properly spacing groups of said devices in said columns and providing electrical insulation between adjacent heat-dissipating means, said chaining means further providing electrical insulation in the row direction between devices and at the top of said devices, said chaining means further being so constructed that large areas of said heat-dissipating means are exposed, and said chaining means being plastic and providing lengthwise and transverse mechanical support.

References Cited

UNITED STATES PATENTS

| | | | |
|---|---|---|---|
| 2,886,747 | 5/1959 | Diebold | 317—234 |
| 3,247,896 | 4/1966 | Chu et al. | 317—100 XR |
| 3,264,534 | 8/1966 | Murphy | 174—35 XR |

ROBERT K. SCHAEFER, *Primary Examiner.*

M. GINSBURG, *Assistant Examiner.*